United States Patent
Barzely

[15] 3,670,254
[45] June 13, 1972

[54] UNDERDAMPED AUDIO PHASE SHIFT OSCILLATOR FOR INCREASING SELECTIVITY OF RADIO RECEIVER

[72] Inventor: Avner Barzely, New York, N.Y.

[73] Assignee: I. Jordan Kunik, New York, N.Y. ; a part interest

[22] Filed: Oct. 14, 1970

[21] Appl. No.: 80,538

[52] U.S. Cl. ....... 330/107, 330/109, 330/112
[51] Int. Cl. ....... H03f 1/36
[58] Field of Search ....... 330/107, 26, 109, 112, 126; 331/137

[56] References Cited

UNITED STATES PATENTS 3,284,719 11/1966 Kahn ....... 330/26
2,230,996 2/1941 Barcus ....... 330/112 X
2,783,373 2/1957 Fowler ....... 331/137 X

*Primary Examiner*—Roy Lake
*Assistant Examiner*—James B. Mullins
*Attorney*—I. Jordan Kunik

[57] ABSTRACT

Underdamped audio phase shift oscillator connected across the audio voltage amplifier section of a radio receiver that sharply increases the selectivity or the response to signal of predetermined frequency and simultaneously relatively attenuates all other frequencies transmitted to output of receiver. The feedback circuit included in the phase shift oscillator is particularly useful in improving the selectivity of a radio receiver working in the continuous wave (C.W.) mode.

10 Claims, 2 Drawing Figures

INVENTOR
AVNER BARZELY
BY
I. Judan Herrick
ATTORNEY

INVENTOR
AVNER BARZELY
BY
ATTORNEY

UNDERDAMPED AUDIO PHASE SHIFT OSCILLATOR FOR INCREASING SELECTIVITY OF RADIO RECEIVER

BACKGROUND OF THE INVENTION

1. Field of the Invention

This invention relates to radio receivers and, more particularly, to an auxiliary feedback phase-shift oscillator circuit which is connected across the audio voltage amplifier section of the receiver whereby the audio frequency response characteristics of the receiver will be altered in a manner to amplify strongly only the signal of a selected, predetermined frequency and simultaneously to attenuate the signals of other frequencies.

2. Description of the Prior Art

Previous methods for improving the selectivity of a radio receiver for C.W. reception comprises:

1. A passive audio filter, which is expensive and bulky; has only a fixed degree of selectivity; whose maximum selectivity does not provide the degree of selectivity permissible and desirable for C.W. reception; has a high output impedance which excludes the use of the standard loudspeaker and requires a high cost, high impedance headset and operates only at a fixed frequency.

2. A Q multiplier which is also expensive; is limited in operation with receivers having a particular I.F. frequency (usually available for frequencies of 455 kHz); requires alignment after installation; and cannot be built into an integrated circuit.

3. Crystal or mechanical filters, which are expensive and bulky; can be installed only in receivers that are designed to accept such types of filters as optional equipment; have fixed degrees of selectivity and fixed frequencies of operation.

4. Audio filter of any type which is designed to be connected to the output of a radio receiver as an added unit. Since the filtering process in most filters is performed at a very low power level, the filter does not transmit any appreciable amount of the available power at the output of the receiver to the load, which is relocated after the filter. Hence, in order to produce the required power level at the output of the filter, a power amplifier must be added to the output of the filtering circuit. Such an improvisation is manifestly a redundancy since the power amplifier at the end of the receiver is virtually rendered useless while further expense is incurred in providing a duplicated power amplifier at the output of the filter.

Where the power amplifier is omitted in prior art audio filters, it is then generally necessary to incur the additional expense of a high impedance headset which may require a lower power level. In either event, the prior art arrangements are inefficient so far as output power is concerned.

The present invention is deemed to constitute an improvement of prior art devices such as disclosed in the following U.S. Pats., Nos. 2,207,962, 3,211,920, 3,263,180, 3,356,962 and 3,448,400. Amongst other things, the system disclosed in said prior art patents either cannot be used in conjunction with a radio receiver, are not suitable for improving the selectivity of a receiver, or cannot be applied for C.W. filtering if variable frequency is desired.

SUMMARY OF THE INVENTION

The foregoing disadvantages of prior art devices are overcome by the novel system of the present invention whereby an underdamped audio phase shift oscillator is connected across the audio voltage amplifier circuit in advance of the audio power amplifier portion of the receiver. By this means, the signal passing through the receiver is connected directly to the transducer of the operator's choice such as a conventional loudspeaker or conventional headset, or the like, thereby obviating the necessity of an additional power amplifier as required in the prior art.

The incorporation of the novel underdamped audio oscillator of the present invention into the receiver involves comparatively little expense, has an adjustable degree of selectivity as well as a provision for continuous adjustment of the frequency of operation. Furthermore, the adaptation of the new phase shift oscillator requires no change in the output circuitry of the receiver, it can be connected to any type of receiver without any requirement for special alignment, and therefore provides a wide range of versatility. The added phase shift oscillator comprises a single transistor circuit with inexpensive resistor-capacitor components which may be built as an accessory external unit that is readily connected to a receiver, or which may be incorporated into the original design of the radio receiver.

The main object of the present invention is to improve the selectivity of a radio receiver working in the C.W. mode. This invention relates to an electronic device which, when properly connected to a radio receiver, will change the audio frequency response characteristics of the receiver so that one, and only one, predetermined audio frequency will be strongly amplified and transmitted to the receiver's output, while all other audio frequencies that differ from the said frequency will be relatively highly attenuated.

The need for the present device becomes apparent especially in receivers whose bandwidth is wider than about 400 Hz. The 2.5 kHz filter found in most single sideband (S.S.B.) receivers or transceivers provides just about the maximum selectivity that can be tolerated in S.S.B. reception with impairing intelligibility. It does not, however, provide the degree of selectivity permissible and desirable for C.W. operation, a mode in which most short wave receivers and transceivers operate. I.F. filters with nominal bandwidth of 400 or 500 Hz are available for some receivers, but they are comparatively expensive, and still do not provide the degree of selectivity that would be desirable for C.W. reception.

Maximum permissible selectivity for the mode under consideration is desirable not only as an aid in eliminating interference from signals on closely adjacent frequencies but also to reduce noise. The effective increase in signal-to-noise ratio that results with increased selectivity is approximately proportional to the log of the bandwidth ratio. As an example, the improvement in signal-to-noise ratio in decreasing the bandwidth from 2.5 kHz to 100 Hz is $10 \log 2.5/0.1 = 10 \log 25 = 13.98$ db or approximately 14 db.

ADVANTAGES OF THE SYSTEM OF THE PRESENT INVENTION

1. Simple Circuitry. The suggested circuit of the present invention consists of a single amplification stage and a few resistors and capacitors, while a typical resonance type audio filter contains at least two voltage amplification stages and one power amplifier stage. Besides, at least two inductors (usually Toroid type) must be included. The total number of components in a typical resonance type audio filter is much higher than the number of components in the suggested circuit of the present invention. In this respect, the suggested filtering method is undoubtedly superior to the conventional method.

2. Lower Power Requirements, Higher Efficiency. Since the suggested circuit does not contain a power amplifier, its power consumption is much lower than that of a conventional prior art audio filter of any type connected to the output of the receiver and having an added power amplifier. As a result of this, the system herein for audio filtering is much more efficient than the conventional method.

3. Degree of Selectivity and Frequency of Operation Are Continuously Adjustable.

(*a*) Selectivity

In the resonance type prior art filter, the degree of selectivity is determined by the number of tuned tank circuits. In order to change the degree of selectivity, it is necessary to control the number of operative tank circuits. This can be accomplished only by switching. In most resonance type filters, there are only two tank circuits, so that the degree of selectivity is adjustable in two rough steps. If it is desired to have many fine steps of selectivity, many low Q tank circuits are required, thereby increasing the cost of a filter.

According to the system herein, the degree of selectivity can be adjusted by means of a potentiometer; thus, any desired degree of selectivity can be obtained. It can be shown that the optimum bandwidth for C.W. reception is a function of the speed rate of the received code. For reception of slow code, the bandwidth can be relatively very narrow. For faster code, the bandwidth should be wider. This is why it is extremely important to be able to adjust the degree of selectivity continuously. With the present system herein, regardless of the speed of the received code, it is always possible to obtain the optimum bandwidth which is unattainable with the resonance type filter.

b. Frequency of Operation

In the resonance audio filter, the frequency of operation is determined by the values of L and C in the tank circuits. In order to change the frequency of operation (usually in the range of 0.5 to 2 kHz) it is most convenient to switch the capacitors of the tank circuits, so that the frequency can be changed in rough steps.

In the system of the present invention, the frequency of operation is determined by a potentiometer so that it can be continuously varied. In this respect, the new system provides the operator with more convenience, as he can choose the frequency that is most pleasant to his ear.

4. Needs No Alignment

In the resonance type audio filter there are two or more tank circuits. For such a filter to work properly, all tank circuits must be tuned to the same frequency. This process of alignment requires a skilled technician with suitable instruments. The alignment procedure might be eliminated by using high precision L and C in the tank circuits; however, such high precision components are more expensive. In the system herein, there are no tuned circuits and there is nothing to tune up. Therefore, this alignment problem does not exist.

5. Pure R–C Circuitry

In a typical resonance type audio filter there are at least two inductors. An inductor for audio disadvantage as far as compactness is concerned. Another disadvantage of an inductor frequencies is relatively large and heavy and, therefore, the use of an audio frequency inductor is a disadvantage of an inductor is that it cannot be combined with an Integrated Circuit.

The system herein comprises a pure R–C circuit, and it contains no inductors. Therefore, it can be built into a smaller space and it will be lighter in weight. If desired, the entire circuit herein can be built as an Integrated Circuit.

These and other novel features and advantages of the present invention will be described and defined in the following specification and claims.

DESCRIPTION OF THE PREFERRED EMBODIMENTS

Figure 1:
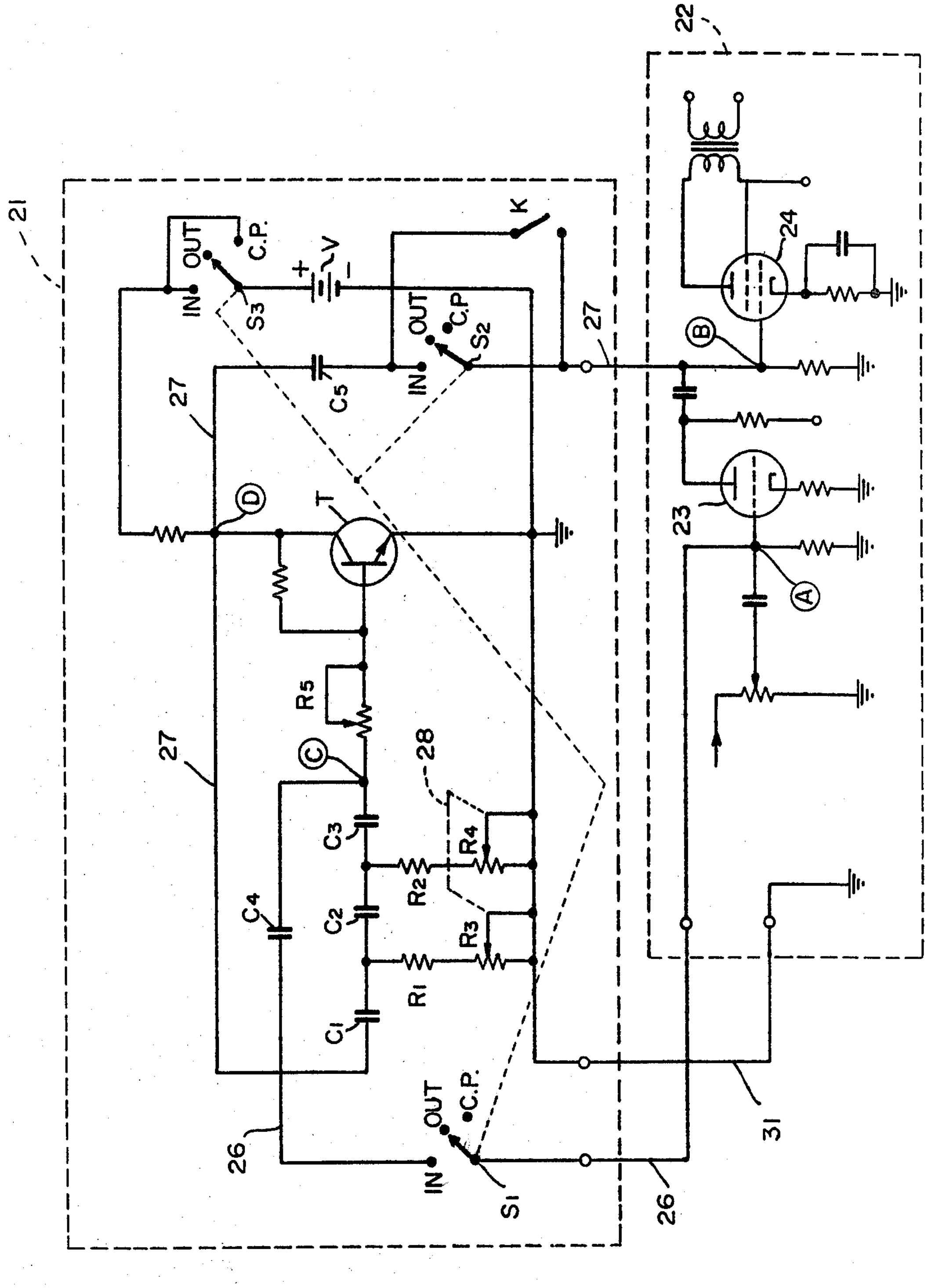
FIG. 1 is a schematic circuit diagram of the audio amplifier portion of a receiver to which is connected the phase shift oscillator of the present invention.

Referring now to the drawings in detail, FIG. 1 shows a schematic representation of the novel phase shift oscillator 21 of the present invention showing the manner in which it is connected to a typical audio amplifier section of a radio receiver 22. The illustration shows the input A to the audio voltage amplifier tube 23 of the receiver, connected by conventional means by way of input B to power amplifier tube 24 which, in turn, is connected through a conventional transformer to a suitable output, not shown, such as earphones, loudspeaker, tape recorder, or the like.

One end of the phase shift oscillator circuit 21 is connected to input A by means of line 26 and the other end is connected to input B by means of line 27, said circuit being connected across voltage amplifier 23. Connected into lines 26 and 27 are switches S-1 and S-2, respectively, which are mounted on the same shaft and operated in unison. Also mounted on the same switch shaft, represented by dotted lines in FIG. 1, is a power switch S-3 which connects a suitable source of voltage V into the phase shift oscillator circuit 21. Each of the switches S-1, S-2 and S-3, have three positions, namely, IN, OUT, and C.P., the latter signifying code practising. In operating the circuit for code practising, a key K is connected into the circuit of line 27 in parallel with switch S-2. Thus, the separate unit of the phase shift oscillator 21 can, at will, be disconnected from receiver 22 (OUT), connected thereto (IN), or operated for code practice (C.P.). The phase shift oscillator has a conventional frequency determining network comprising capacitors C-1, C-2 and C-3, in series, said capacitor circuit having a pair of branches including fixed resistors R-1 and R-2, respectively, which, in turn, are connected to respective variable resistors R-3 and R-4, in series therewith, said variable resistors R-3 and R-4 being coupled to each other by means of common shaft 28.

The feedback network comprising capacitors C-1, C-2 and C-3, and R-1, R-2, R-3 and R-4, are connected by way of feedback junction C to feedback line 26. Connected in the circuit between feedback junction C and input A is a coupling capacitor C-4 which blocks D.C. and passes A.C. signals. C-5 is also a coupling capacitor which blocks D.C. and passes A.C. signals and is located in series with line 27 between S-2 and junction D. Connected between junction C and line 27 is a variable control resistor R-5 and a transistor amplifier T, said variable resistor R-5 being connected to the base of said transistor amplifier T while the collector of said transistor amplifier is connected to line 27. The emitter of transistor amplifier T is connected to ground, as are several other of the components of the oscillator, in a manner well known to those skilled in the art. Other capacitors and resistors are included in the circuits of both the receiver and the oscillator in locations where necessary or desirable, in the manner also well known to those skilled in the art.

Transistor amplifier T is an active device which may, in some embodiments, be replaced by other types of active devices such as vacuum tubes, field effect transistors, operational amplifiers and the like, with suitable modifications in circuitry known to those skilled in the art.

Between input A to the audio voltage amplifier tube 23 and input B to the power amplifier tube 24, there exists a phase difference of 180°. Between input B and junction D there is a zero phase difference. Between junction D and feedback junction C there is a phase shift of 180°. Therefore, when the signal passes from junction C to input A, said signal will be restored to the same phase as the signal of the selected, desired frequency that is be to amplified by tubes 23 and 24. It is to be understood, however, that the purpose of shifting phase is to bring about a feedback signal which is to be brought into phase with the input of the audio amplifier. Accordingly, other types of oscillator circuits may be utilized where, by appropriate circuit connection, the requisite phase shift is achieved for reinforcing the signal at junction A or the input of the audio amplifier, regardless of the total phase difference across the audio voltage amplifier which, in some embodiments, can consist of more than one stage.

The desired frequency at which phase shift oscillator 21 is to operate is selected by determining the requisite or suitable values of capacitors C-1, C-2 and C-3, and of the fixed resistors R-1 and R-2. The fine tuning for producing the precise selected frequency is achieved by varying the values of coupled resistors R-3 and R-4 by means of a suitable knob, not shown, connected to shaft 28.

The foregoing frequency determining network comprising capacitor C-1, C-2 and C-3, fixed resistors R-1, and R-2, and variable coupled resistors R-3 and R-4, is capable of varying the frequency to any desired frequency in those audio ranges encountered in C.W. operation, as for example, 500 Hz to 2,000 Hz. The operator manipulates shaft 28 for tuning to the frequency that is most aurally acceptable and pleasant to him.

In the phase shift oscillator 21, variable resistor R-5 controls the amount of feedback from the collector to the base of transistor T. The coupled resistors R-3 and R-4 determine the frequency of operation. When switch S is in the OUT position, receiver 22 works normally in its usual mode of operation. When switch S is in the IN position, input A is coupled to junction C in oscillator 21 through capacitor C-4, while input B in the receiver will be coupled to junction D in oscillator 21 through capacitor C-5. Junction C is at the output of the feedback circuit which transmits the feedback signal through line 26 to input A.

The variable resistor R-5 is normally adjusted to a point where the strength of the feedback from collector to base of transistor T is just short of sustaining any self-generated oscillations and thus oscillator 21 will not produce any output.

Since input B and junction D are coupled, any signal that will appear at input B during receiving periods will also appear at junction D. At a certain desired setting of variable resistor R-5, the oscillator circuit is extremely sensitive to signals having the frequency to which variable coupled resistors R-3 and R-4 are set. The presence of a signal with the set desired or predetermined frequency at input B will immediately cause oscillator 21 to start operating at the same frequency. While oscillator 21 operates, the voltage at feedback junction C will rise to a much higher level and this voltage will appear instantly at input A since junction C and input A are coupled by feedback line 26.

Essentially, the signal at feedback junction C will be in phase with the signal at input A and as a result, the amplitude of the signal at input A will be increased. Input A is connected to the control grid of audio voltage amplifier tube 23 and, therefore, with the higher voltage level at input A, the output of the signal at the selected frequency will accordingly be much stronger. Therefore, a signal of the desired frequency will be highly favored by the combined oscillator-receiver circuit.

Figure 2:
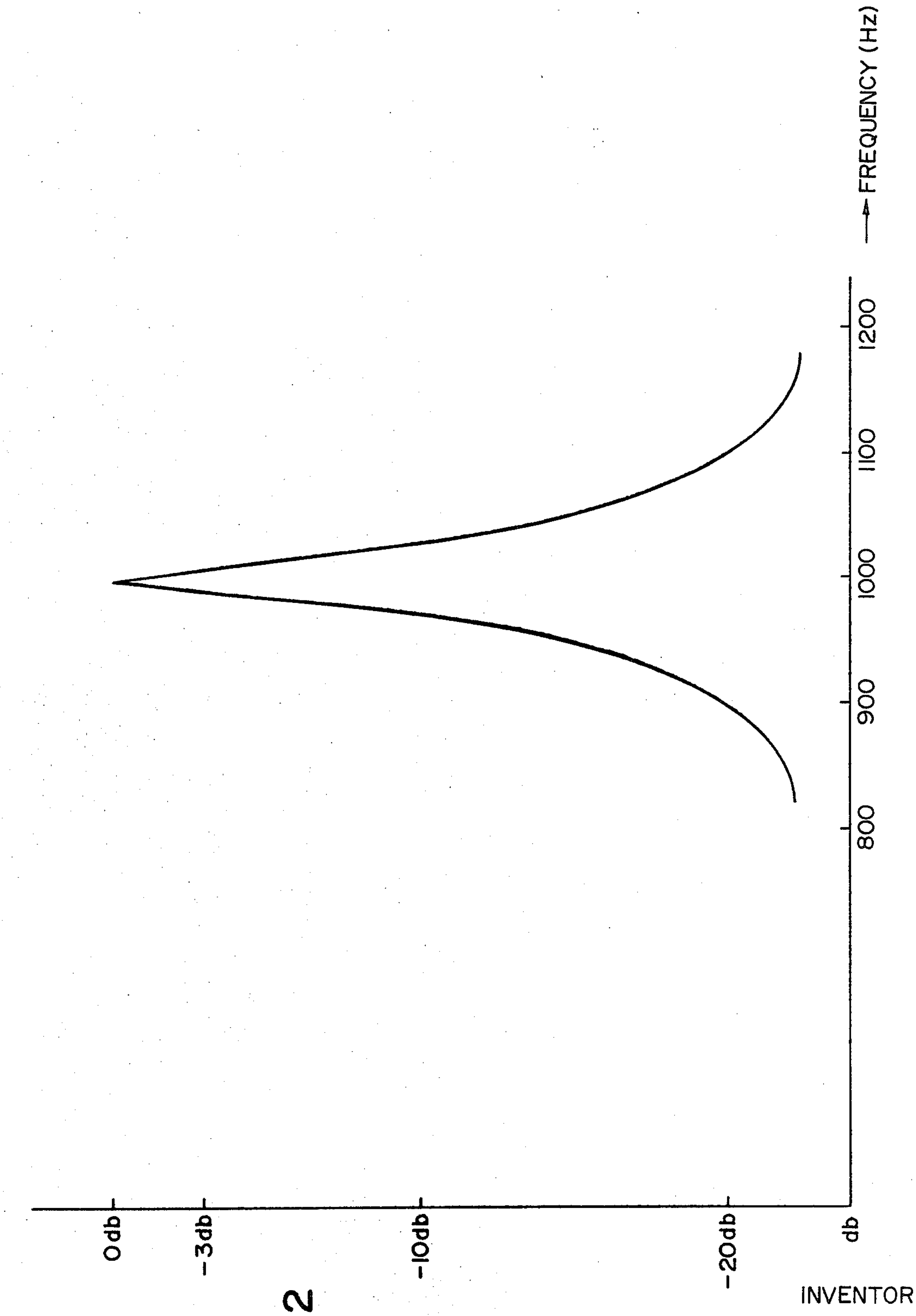
FIG. 2 represents a typical frequency response curve at the output of the receiver when the phase shift oscillator of the present invention is properly connected thereto.

The response curve of the receiver circuit when phase shift oscillator 21 is connected to the receiver, is shown in FIG. 2, where frequency in Hertz is plotted against audio gain in db. This curve represents the response of the audio amplifier section of the receiver with the active audio filter or phase shift oscillator of the present invention connected to the receiver which, as a result, selectively favors a signal of the particular desired or predetermined frequency.

In some embodiments, for circuit simplicity, coupled variable resistors R-3 and R-4 may be replaced by fixed resistors of particular selected values in order to predetermine the optimum or desired frequency which will be transmitted through said oscillator by feedback means to the input A of receiver 22.

Although the phase shift oscillator herein is shown in FIG. 1 as being connected to a tube-type receiver, it is contemplated that said oscillator with the same circuit can be connected to a transistorized receiver, in which case impedance matching consideration will be required by means well known to those skilled in the art.

In operation, after switch S is manipulated into the IN position, the natural tendency of said oscillator to generate a signal of a predetermined frequency is overcome by increasing the resistance of R-5, whereby the oscillator is prevented from generating its self-induced oscillations.

The operation proceeds in the following steps:

a. The coupled variable resistors R-3 and R-4 are set to tune the oscillator to the desired frequency of the signal that is to be amplified selectively by the amplifier portion of receiver 22.

b. Variable resistor R-5 is adjusted to a point where the signal that is normally self-generated by oscillator 21 is quenched or underdamped. In this condition, oscillator 21 is in readiness to receive external signals of any audio frequency from input B. However, it will react only at the presence of a frequency equal to that to which the phase shift oscillator 21 was tuned in step (a).

c. The signal of the selected frequency received by oscillator 21 from audio voltage amplifier 23 of receiver 22 is then amplified by the oscillator circuit which includes transistor amplifier T, and the amplified signal is then fed by way of feedback line 26 to input A of audio voltage amplifier tube 23 and through power amplifier tube 24 to the amplifier output which may comprise any suitable device such as earphones, loudspeaker, tape recorder, or the like.

Even though variable resistor R-5 may be deemed or considered as part of the frequency-determining network of oscillator 21, nevertheless in actual practice said resistor R-5 has a negligible effect upon the predetermined or preselected frequency established by the coupled variable resistors R-3 and R-4 in said network.

Phase shift oscillator 21 herein may be built into a separate small cabinet, in the control panel of which is located a suitable knob for rotating switch S into any selected one of its three positions, a suitable knob for rotating shaft 28, a suitable knob for adjusting R-5, and a suitable jack for plugging key K. Lead lines 26 and 27, extending from said cabinet, can readily be connected into the receiver circuit at junction A and B, respectively, which is within the purview of the mechanic skilled in the art. A third lead line 31 extending from said cabinet can be connected to ground in the manner well known in the art. Alternatively, it is contemplated that phase shift oscillator circuit 21 may be incorporated as original equipment in receiver 22 with the foregoing actuating components being mounted in the control panel of the receiver. Oscillator 21 may also be used as a code practice circuit.

When S is in the IN position, a continuous audio tone will result if the setting of resistor R-5 is advanced beyond its critical setting. This property can be useful for the purpose of code practising, so that the very same circuit can be used for two purposes.

The mode of operation is determined by the position of switch S. This switch has three positions: OUT, IN and C.P. (C.P. stands for code practising). When switch S is in the OUT position, the unit is disconnected from the receiver. When switch S is in the IN position, the circuit will work in the filtering mode as described earlier. When switch S is in the C.P. position, and resistor R-5 is advanced far enough, the oscillator will work continuously; however, nothing will be heard as yet because there is no connection between the oscillator and the receiver's audio amplifier. When closing the key K, some voltage from the oscillator will be fed to the grid of audio power amplifier 24. Accordingly, a tone will be heard at the output of the receiver 22 whenever the key is closed, so that the operator can engage in code practice.

Although the present invention has been described with reference to particular embodiments and examples, it will be apparent to those skilled in the art that variations and modifications can be substituted therefor without departing from the principles and true spirit of the invention. The "Abstract" given above is for the convenience of technical searchers and is not to be used for interpreting the scope of the invention or claims.

I claim:

1. A system for selectively amplifying a predetermined audio frequency in association with a separate radio receiver audio amplifier having an audio voltage amplifier and an audio power amplifier in series, comprising an independent phase shift oscillator circuit which includes an active device and a frequency determining network, said oscillator circuit being connected between the input of said audio voltage amplifier and the input of said audio power amplifier, means in said frequency-determining network to vary and determine the frequency characteristic of said network, a potentiometer connected between said frequency-determining network and the input to said active device for initially quenching any self-generated oscillations of said oscillator circuit, and coupling capacitors connected between said frequency determining network and the inputs of said audio voltage and power amplifiers, respectively.

2. A system according to claim 1 wherein said active device comprises a transistor amplifier connected in the circuit of said potentiometer and said frequency-determining network.

3. A system for selectively amplifying a predetermined audio frequency in association with a radio receiver audio amplifier having an audio voltage amplifier and an audio power amplifier in series, comprising an oscillator circuit connected across said audio voltage amplifier only, said oscillator circuit including first means for establishing a specific frequency which is transmissible through said oscillator circuit, and second means for quenching any self-generated oscillations of said oscillator circuit.

4. A system according to claim 3 wherein said first means changes the phase of the signal received from said audio power amplifier 180°, and further comprising third variable means for tuning and setting said first means to a desired frequency.

5. A system according to claim 4 and further comprising fourth variable means for tuning said second means to the extent necessary for quenching said self-generated oscillations.

6. A system according to claim 5 and further comprising an active device in the circuit of said first and second means.

7. A system according to claim 6 wherein said second means is a potentiometer connected between said first means and said active device.

8. A system according to claim 7 and further comprising fifth means connected between said first means and the input of said audio voltage amplifier for blocking D.C. and passing an A.C. signal.

9. A system according to claim 8 wherein said fifth means comprises a coupling capacitor.

10. A system for selectively amplifying a predetermined audio frequency in association with a radio receiver audio amplifier having an audio voltage amplifier and an audio power amplifier in series, comprising an oscillator circuit connected across said audio voltage amplifier only, said oscillator circuit including first means for establishing a specific frequency which is transmissible through said oscillator circuit, and second means for transmitting a feedback signal of said specific frequency to the input of said audio voltage amplifier which is in phase with and reinforces the normal signal of the same frequency at the input of said audio voltage amplifier.

* * * * *

PO-1050
(5/69)

UNITED STATES PATENT OFFICE
CERTIFICATE OF CORRECTION

Patent No. 3,670,254 Dated June 13, 1972

Inventor(s) Avner Barzely

It is certified that error appears in the above-identified patent and that said Letters Patent are hereby corrected as shown below:

Column 3, delete lines 41-47, and substitute therefor the following:

-- In a typical resonance type audio filter there are at least two inductors. An inductor for audio frequencies is relatively large and heavy and, therefore, the use of an audio frequency inductor is a disadvantage as far as compactness is concerned. Another disadvantage of an inductor is that it cannot be combined with an Integrated Circuit. --

Signed and sealed this 10th day of October 1972.

(SEAL)
Attest:

EDWARD M.FLETCHER,JR.
Attesting Officer

ROBERT GOTTSCHALK
Commissioner of Patents